United States Patent
Kim et al.

(10) Patent No.: US 8,325,517 B2
(45) Date of Patent: Dec. 4, 2012

(54) NONVOLATILE MEMORY DEVICE AND METHOD OF DRIVING THE SAME

(75) Inventors: Hyung-Gon Kim, Suwon-Si (KR); Sung-Soo Lee, Seongnam-si (KR)

(73) Assignee: Samsung Electronics Co., Ltd., Suwon-sii, Gyeonggi-do (KR)

( * ) Notice: Subject to any disclaimer, the term of this patent is extended or adjusted under 35 U.S.C. 154(b) by 87 days.

(21) Appl. No.: 12/472,636

(22) Filed: May 27, 2009

(65) Prior Publication Data

US 2009/0296467 A1    Dec. 3, 2009

(30) Foreign Application Priority Data

Jun. 3, 2008 (KR) .................. 10-2008-0052241

(51) Int. Cl.
*G11C 11/34* (2006.01)
*G11C 16/04* (2006.01)
*G06F 13/00* (2006.01)

(52) U.S. Cl. .................. 365/185.03; 711/103

(58) Field of Classification Search ............. 365/185.03, 365/185.24, 185.28; 711/103
See application file for complete search history.

(56) References Cited

U.S. PATENT DOCUMENTS

| | | | |
|---|---|---|---|
| 5,712,818 A | 1/1998 | Lee et al. | |
| 2007/0171711 A1* | 7/2007 | Kang et al. | 365/185.03 |
| 2008/0084739 A1* | 4/2008 | Chae et al. | 365/185.03 |
| 2008/0089123 A1* | 4/2008 | Chae et al. | 365/185.03 |
| 2008/0162789 A1* | 7/2008 | Choi et al. | 711/103 |
| 2008/0259686 A1* | 10/2008 | Hwang | 365/185.03 |
| 2009/0031074 A1* | 1/2009 | Son | 711/103 |
| 2009/0147574 A1* | 6/2009 | Jeong et al. | 365/185.03 |
| 2009/0161425 A1* | 6/2009 | Kim et al. | 365/185.03 |
| 2009/0225593 A1* | 9/2009 | Cha et al. | 365/185.03 |

FOREIGN PATENT DOCUMENTS

| | | |
|---|---|---|
| KR | 1020010070086 | 7/2001 |
| KR | 1020040048344 | 6/2004 |
| KR | 1020070012810 | 1/2007 |

* cited by examiner

*Primary Examiner* — Ly D Pham
(74) *Attorney, Agent, or Firm* — Volentine & Whitt, PLLC

(57) ABSTRACT

Disclosed is a program method of a non-volatile memory device. The program method includes performing a least significant bit (LSB) program operation, during which an LSB program number is stored, and performing a most significant bit (MSB) program operation in a threshold voltage state order determined according to the LSB program number.

18 Claims, 6 Drawing Sheets

US 8,325,517 B2

NONVOLATILE MEMORY DEVICE AND METHOD OF DRIVING THE SAME

CLAIM OF PRIORITY

A claim of priority under 35 U.S.C. §119 is made to Korean Patent Application No. 10-2008-0052241 filed on Jun. 3, 2008, the entire contents of which are hereby incorporated by reference.

SUMMARY

Embodiments of the present invention relate to a non-volatile memory device and a method of driving a non-volatile memory device.

Storage devices, including as volatile and non-volatile memories, are used extensively in mobile devices, such as MP3 players, portable media players (PMPs), cellular phones, notebook computers, personal digital assistants (PDAs), and the like. Such mobile devices increasingly require mass storage to support various complex functions (e.g., moving picture reproduction). To meet this demand, multi-bit memory devices have been developed, which store two or more bits in one memory cell.

When 1-bit data is stored in a memory cell, the memory cell has a threshold voltage corresponding to one of two possible threshold voltage distributions. That is, the memory cell may have one of two states, respectively corresponding to data "0" and data "1". In comparison, when 2-bit data is stored in a memory cell, the memory cell has a threshold voltage corresponding to one of four possible threshold voltage distributions. That is, the memory cell may have one of four states, respectively corresponding to data "11", data "10", data "01" and data "00".

When the threshold voltage of a memory cell increases toward another threshold voltage having a state higher than an "on" state (e.g., an erased state), the memory cell is said to be "programmed." A program operation of a 2-bit memory cell is divided into a least significant bit (LSB) program operation and a most significant bit (MSB) program operation. In a NAND flash memory having 2-bit memory cells, for example, the MSB program operation is performed after the LSB program operation is performed.

Also, in a NAND flash memory, memory cells connected to one word line may be programmed at the same time, which is referred to as a "normal program operation." Alternatively, memory cells connected to one word line may be programmed through multiple program operations, without erasing the memory cells, which is referred to as a "partial program operation." The partial program operation may be used, for example, when data is managed in a size less than a page size.

Embodiments of the present invention provide a non-volatile memory device and a method of driving a non-volatile memory device, according to which multiple threshold voltage state orders are adopted, according to the type of programming. This improves the speed of a read operation, for example, by performing MSB program and read operations after changing threshold voltage state orders according to whether a partial program operation is performed.

One aspect of the present invention provides a program method of a non-volatile memory device. The program method includes performing an LSB program operation, during which an LSB program number is stored, and performing an MSB program operation in a threshold voltage state order determined according to the LSB program number.

Another aspect of the present invention provides an MSB read method of a non-volatile memory device. The read method includes identifying an LSB program number; determining a threshold voltage state order according to the LSB program number; and performing an MSB read operation based on the determined threshold voltage state order.

Another aspect of the present invention provides a non-volatile memory device including a memory cell array, a row decoder, a page buffer and a control logic circuit. The memory cell array includes multiple memory cells and multiple flag cells, the memory cells being arranged at intersections of word lines and bit lines, and the flag cells being arranged at intersections of the word lines and partial program bit lines. The row decoder selects a word line to be driven according to an input address. The page buffer temporarily stores data read out from or to be stored to memory cells and flag cells via the bit lines and the partial program bit lines. The control logic circuit controls the row decoder and the page buffer to store an LSB program number in flag cells connected to a selected word line during an LSB program operation, in response to an externally provided control signal.

BRIEF DESCRIPTION OF THE FIGURES

The attached drawings illustrate exemplary and non-limiting embodiments of the present invention, where like reference numerals refer to like parts throughout the figures unless otherwise specified.

DETAILED DESCRIPTION OF PREFERRED EMBODIMENTS

Figure 1:
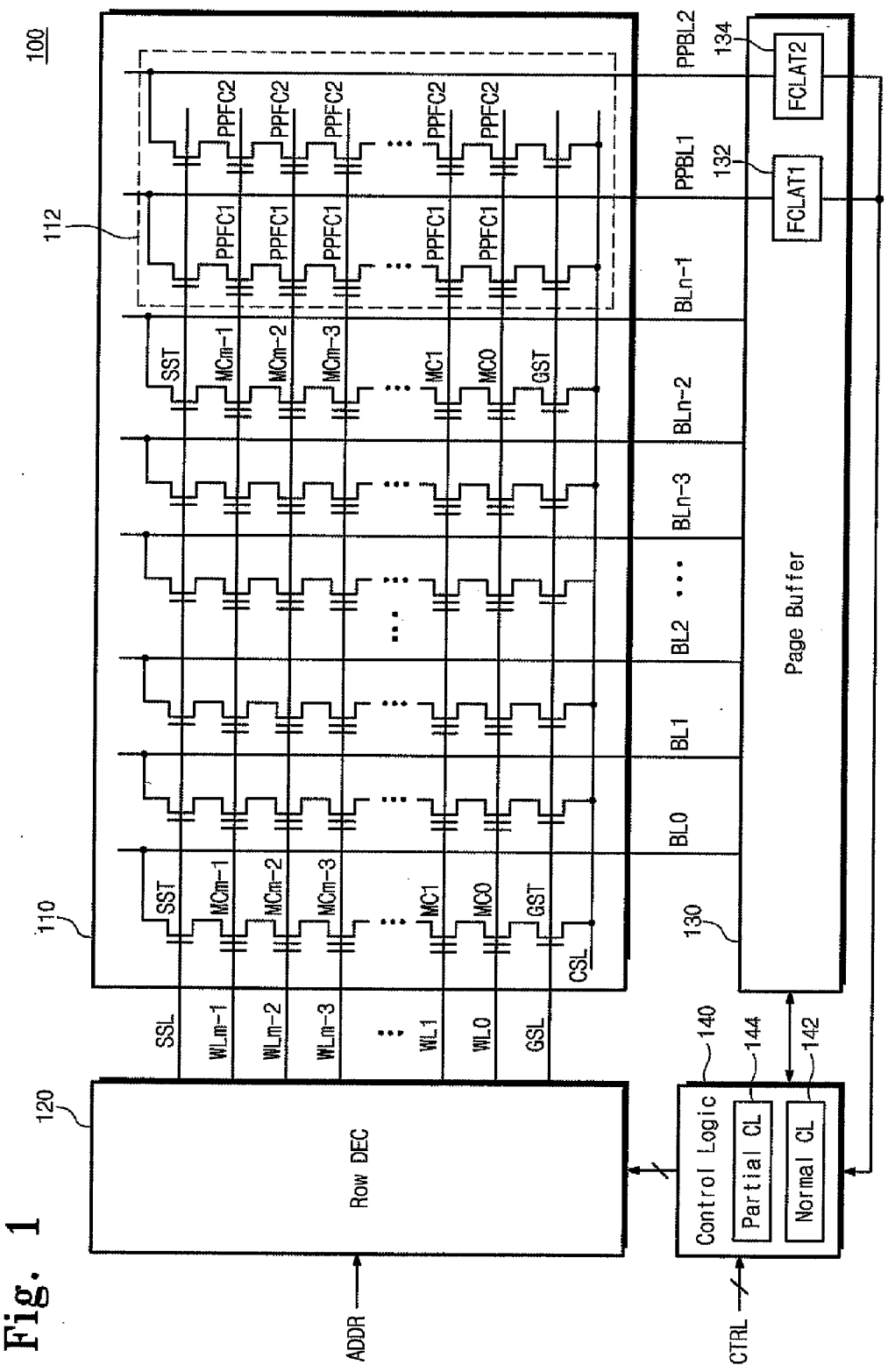
FIG. 1 is a block diagram showing a non-volatile memory device, according to an illustrative embodiment.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

According to various embodiments, a non-volatile memory device is configured to store an LSB program number during an LSB program operation, indicating the number of the LSB program operation. The non-volatile memory device then performs an MSB program operation using threshold voltage states arranged in a particular order according to the stored LSB program number. For example, the LSB program number may be used to determine whether a partial program operation is to be carried out. In this manner, the non-volatile memory device conducts normal and partial program operations using different threshold voltage state orders in accordance with the LSB program number. As a result, the non-volatile memory device is able to perform a partial program operation and/or an MSB read operation at a relatively fast speed.

FIG. 1 is a block diagram showing a non-volatile memory device, according to an illustrative embodiment.

Referring to FIG. 1, a non-volatile memory device 100 includes a memory cell array 110, a row decoder 120, a page buffer 130 and control logic circuit 140. An LSB program number is stored in each set of first and second partial program flag cells PPFC1 and PPFC2 in area 112 of the memory cell array 110, discussed below. The control logic circuit 140 may be implemented, for example, using a software-controlled microprocessor, hard-wired logic circuits, or a combination thereof. The control logic circuit 140 determines whether a partial program operation or a normal program operation is to be performed with respect to a word line, according to the information stored in the first and second partial program flag cells PPFC1 and PPFC2. Herein, the partial program operation refers to multiple program operations conducted with respect to memory cells connected to one word line, without an intervening erase operation. An example of a partial program operation is disclosed in U.S. Pat. No. 5,712,818, entitled "Data Loading Circuit for Partial Program of Nonvolatile Semiconductor Memory," issued Jan. 27, 1998, the contents of which are hereby incorporated by reference.

The non-volatile memory device 100 illustrated in FIG. 1 may be a NAND flash memory device, for example. However, it is apparent that the non-volatile memory device 100 may include other types of memory without departing from the scope of the present teachings. For example, in various embodiments, the non-volatile memory device 100 may be magnetoresistive random access memory (MRAM), phase-change random-access memory (PRAM), RFAM, and the like.

The memory cell array 110 includes representative bit lines BL0 to BLn−1, representative word lines WL0 to WLm−1, and memory cells arranged at intersections of the bit lines BL0 to BLn−1 and the word lines WL0 to WLm−1. The memory cell array 110 may be formed of multiple memory blocks, although only one memory block is illustrated in FIG. 1. Each of the memory blocks includes multiple cell strings, each of which includes a string select transistor SST, a ground select transistor GST, and memory cells MC0 to MCm−1 connected in series between the string select transistor SST and the ground select transistor GST.

In each of the cell strings of the depicted embodiment, a drain of a string select transistor SST is connected to a corresponding bit line BL0 to BLn−1, and a source of a ground select transistor GST is connected to a common source line CSL. The word lines WL0 to WLm−1 are arranged to intersect the cell strings and to connect with control gates of corresponding memory cells MC0 to MCm−1 in each cell string, respectively. Data is programmed to/read from selected memory cells when a program/read voltage is applied to a selected word line. The bit lines BL0 to BLn−1 are connected electrically with the page buffer 130.

The memory cell array 110 also includes an area 112, which has multiple partial program flag cells PPFC1 and PPFC2 respectively arranged at intersections of partial program bit lines PPBL1 and PPBL2 and the word lines WL0 to WLm−1. Each of the word lines WL0 to WLm−1 is connected to a first partial program flag cell PPFC1 and a second partial program flag cell PPFC2. Each set of the first and second partial program flag cells PPFC1 and PPFC2 stores an LSB program number. For example, in an embodiment, when the LSB program number is 1, data "0" is stored in the first partial program flag cell PPFC1 and data "1" is stored in the second partial program flag cell PPFC2. When the LSB program number is 2, data "0" is stored in the first partial program flag cell PPFC1 and data "0" is stored in the second partial program flag cell PPFC2. In the various embodiments, the order of threshold voltage states in an MSB program operation is determined according to the LSB program number stored in the first and second partial program flag cells PPFC1 and PPFC2.

The row decoder 120 selects a memory block according to an input address ADDR and selects a word line to be driven in the selected memory block. For example, the row decoder 120 may select a word line to be driven in the selected memory block by decoding the address ADDR input during a program operation. A program voltage from a high voltage generator (not shown) may be applied to the selected word line.

The page buffer 130 temporarily stores data to be written to the memory cell array 110 during a program operation and/or temporarily stores data read out from the memory cell array 110 during a read operation. The page buffer 130 is connected to the memory cell array 110 via the bit lines BL0 to BLn−1. The page buffer 130 may include latches (not shown) corresponding to the respective bit lines BL0 to BLn−1. Each of the latches stores data to be programmed to or data read out from the memory cell array 110.

The page buffer 130 applies a ground voltage (e.g., GND) or a power supply voltage VDD to each bit line according to data values stored in the latches. For example, the ground voltage GND is applied to a bit line connected to a latch that stores data "0" (e.g., a bit line connected to a memory cell to be programmed), and a power supply voltage VDD is applied to a bit line connected to a latch that stores data "1" (e.g., a bit line connected to a memory cell to be program inhibited).

The page buffer 130 also includes first and second flag cell latches FCLAT1 132 and FCLAT2 134, which are electrically connected to the first and second partial program flag cells PPFC1 and PPFC2 via the partial program bit lines PPBL1 and PPBL2, respectively.

The control logic circuit 140 generates high voltages for each mode of operation in response to input control signal CTRL (e.g., /CE, /RE, /WE, CLE, ALE, /WP, etc.). The control logic circuit 140 provides the high voltages to the row decoder 120. Further, the control logic circuit 140 may control the various elements of the non-volatile memory device 100.

The control logic circuit 140 may include first control logic circuit 142 and second control logic circuit 144. The first control logic circuit 142 is used to perform a program/read operation according to a first threshold voltage state order, and the second control logic circuit 144 is used to perform a program/read operation according to a second threshold voltage state order. In the depicted example, the second threshold voltage state order is the order of threshold voltage states that supports a partial program operation. The first and second control logic circuits 142 and 144 may share LSB program/read operation functionality, although the first and second control logic circuits 142 and 144 control MSB program/read operation to be performed in different manners. The first control logic circuit 142 may be referred to as a normal control logic circuit, and the second control logic circuit 144 may be referred to as a partial control logic circuit.

The control logic circuit 140 selects one of the first and second control logic circuits 142 and 144 based on data stored in the first and second partial program flag cells PPFC1 and PPFC2, which provide the LSB program number of the selected word line. For example, when the LSB program number is 2 (or more), indicated by data "0" stored in the first and second partial program flag cells PPFC1 and PPFC2, an MSB program/read operation is performed under the control of the second control logic circuit 144. On the other hand, when the LSB program number is 1, indicated by data "0" stored in the first partial program flag cell PPFC1 and data "1" stored in the second partial program flag cell PPFC2, an MSB program/read operation is performed under the control of the first control logic circuit 142.

Accordingly, the non-volatile memory device 100 is able to change the threshold voltage state order in response to the LSB program number of a selected word line during a program operation. Thus, the non-volatile memory device 100 can correspond to a partial program operation and an MSB read operation, which have a relatively fast speed. This will be more fully described with reference to FIG. 2, below.

Figure 2:
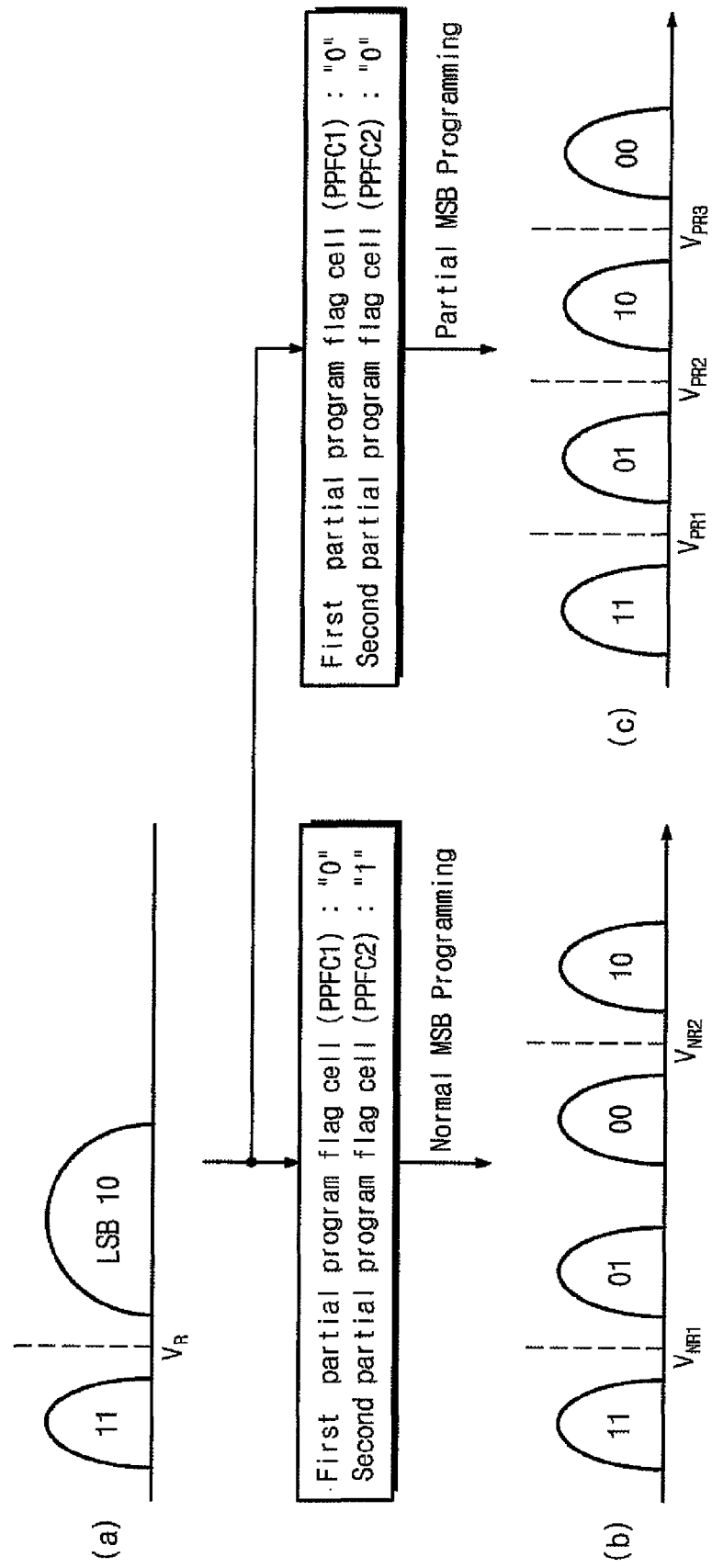
FIG. 2 is a diagram showing threshold voltage state orders of a non-volatile memory device, according to an illustrative embodiment.

FIG. 2 is a diagram showing orders of threshold voltage states in the non-volatile memory device of FIG. 1, according to an illustrative embodiment. In particular, FIG. 2(a) shows threshold voltage states after an LSB program operation, FIG. 2(b) shows threshold voltage states after a normal MSB program operation, and FIG. 2(c) shows threshold voltage states after a partial MSB program operation. The non-volatile memory device 100 may change the order of threshold voltage states during a program operation according to data stored in the first and second partial program flag cells PPFC1 and PPFC2.

The illustrative embodiment depicted in FIG. 2 does not show the case in which a partial program operation is performed with respect to LSB data and a normal program operation is performed with respect to MSB data. Further, during a partial program operation, an LSB program operation is conducted at least twice with respect to one word line, indicated by LSB program number 1 and LSB program number 2, respectively.

Figure 3:
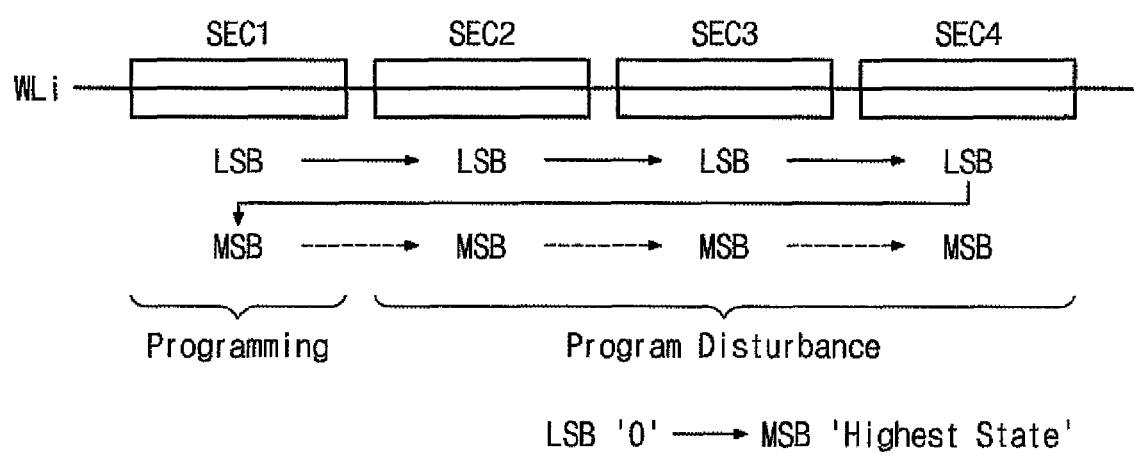
FIG. 3 is a diagram showing an exemplary partial program operation with respect to one word line, according to an illustrative embodiment.

FIG. 3 is a diagram showing a partial program operation with respect to one word line, according to an illustrative embodiment.

Referring to FIG. 3, memory cells connected to representative word line WLi are divided into four sectors SEC1 to SEC4. During a partial program operation, a partial LSB program operation is performed with respect to each of the sectors SEC1 to SEC4, and then a partial MSB program operation is performed with respect to each of the sectors SEC1 to SEC4.

For example, the non-volatile memory device 100 may program an LSB program number during an LSB program operation. When the LSB program operation is first conducted with respect to a selected word line, data "0" is stored in the first partial program flag cell PPFC1, while the second partial program flag cell PPFC2 is not programmed, and thus maintains a previous state (data "1"). Herein, conducting the LSB program operation means that both LSB data to be programmed and data related to the LSB program number are stored.

In a partial program operation, an LSB program operation is conducted at least twice with respect to a selected word line. When the second LSB program operation is performed with respect to a selected word line, the first partial program flag cell PPFC1 maintains a previous state (data "0") and data "0" is stored in the second partial program flag cell PPFC2. When another LSB program operation is conducted with respect to the selected word line, that is, when the LSB program number is 3, each of the first and second partial program flag cells PPFC1 and PPFC2 maintains its previous state. As described above, the non-volatile memory device 100 may store an LSB program number during an LSB program operation. As illustrated in Table 1, data states of partial program flag cells PPFC1 and PPFC2 are determined according to an LSB program number.

TABLE 1

| LSB_PGM_NO. | PPFC1 | PPFC2 |
|---|---|---|
| 1 | 0 | 1 |
| 2 | 0 | 0 |

The non-volatile memory device 100 may be configured such that a partial program operation is conducted when an LSB program operation is conducted at least twice with respect to a selected word line.

Referring to the Table 1, when a normal program operation is conducted during an LSB program operation (the LSB program number is 1), i.e., when data "0" is stored in the first partial program flag cell PPFC1 and data "1" is stored in the second partial program flag cell PPFC2, MSB data is programmed in the first threshold voltage state order illustrated in FIG. 2(b). That is, the first control logic circuit 142 in FIG. 1 controls a program operation in accordance with the first threshold voltage state order during an MSB program operation.

Referring to FIG. 2(b), during a normal MSB program operation, the first threshold voltage state order may be states "11", "01", "00" and "10", for example. When using the first threshold voltage state order, a read operation is conducted twice using read voltages $V_{NR1}$ and $V_{NR2}$ during an MSB read operation. Also, no partial program operation may be conducted since the "10" state has a higher threshold voltage distribution than the "00" state, as described with reference to FIG. 3.

Also, when a partial MSB program operation is conducted with respect to the first sector SEC1, each of the second to fourth sectors SEC2 to SEC4 has an MSB cell distribution since a corresponding page is MSB programmed. Thus, memory cells of the second to fourth sectors SEC2 to SEC4, which are programmed to have data "0" during an LSB program operation, may be programmed to have the MSB state "10" according to the first threshold voltage order. For a NAND flash memory device, the threshold voltage changes in a positive (i.e., increasing) direction, but does not change in a negative (i.e., decreasing) direction. For this additional reason, the second to fourth sectors SEC2 to SEC4 cannot be partially programmed.

Referring again to Table 1, when a partial program operation is conducted during an LSB program operation (LSB program number is 2), i.e., when data "0" is stored in each of the first and second partial program flag cells PPFC1 and PPFC2, MSB data is programmed in the second threshold voltage state order, illustrated in FIG. 2C. That is, the second control logic circuit 144 in FIG. 1 controls a partial MSB program operation in accordance with the second threshold voltage state order during an MSB program operation.

Referring to FIG. 2(c), the second threshold voltage state order may be, for example, states "11", "01", "10" and "00" during a partial MSB program operation. Using the second threshold voltage state order, a read operation is conducted three times using read voltages $V_{PR1}$, $V_{PR2}$, and $V_{PR3}$ during an MSB read operation. Also, a partial program operation may be conducted.

Accordingly, the non-volatile memory device 100 is able to conduct program operations in different threshold voltage state orders, based on the LSB program number. As illustrated in FIG. 2, when the non-volatile memory device 100 does not use a partial program scheme, an MSB program operation is performed in the first threshold voltage state order. On the other hand, when the non-volatile memory device 100 uses a partial program scheme, an MSB program operation is performed in the second threshold voltage state order. The non-volatile memory device 100 corresponds to a partial program operation and improves read operation speed.

Figure 4:
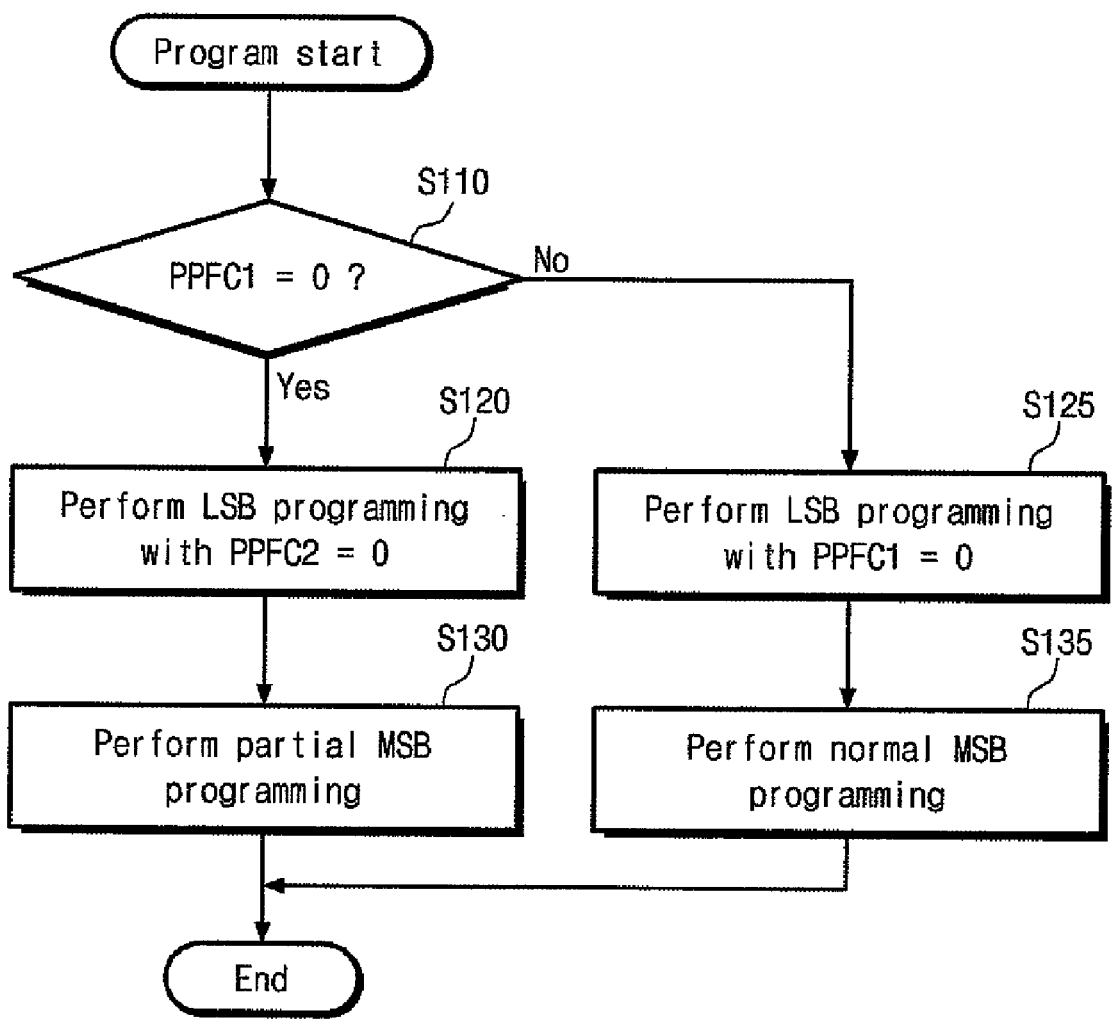
FIG. 4 is a flow chart showing a program method of a non-volatile memory device, according to an illustrative embodiment.

FIG. 4 is a flow chart showing a program method of a non-volatile memory device, according to an illustrative embodiment. A program method of non-volatile memory device 100 will be more fully described below with reference to FIGS. 1 to 4.

When a program command and address ADDR are received, e.g., input from an external device, data is read from the first partial program flag cell PPFC1 connected to a word line corresponding to the address ADDR, through the first partial program latch FCLAT1 132 connected to the first partial program bit line PPBL1. In step S110, the control logic circuit 140 determines whether the data read from the partial program latch FCLAT1 132 is data "0," indicating whether the first partial program flag cell PPFC1 stores data "0".

For example, when data "1" is stored in each of the first and second partial program flag cells PPFC1 and PPFC2 (i.e., the first partial program flag cell PPFC1 is not data "0"), indicating that an LSB program operation has not been carried out data "0" is stored in the first partial program flag cell PPFC1 during an LSB program operation in step S125. At this time, the second partial program flag cell PPFC2 is program inhibited, such that previously stored data (i.e., data "1") is maintained.

Since the first and second partial program flag cells PPFC1 and PPFC2 connected to the word line selected by the address ADDR have data "0" and data "1", respectively, a normal MSB program operation may be conducted in step S135 using the first threshold voltage state order.

Referring again to step S110, when data "0" is stored in the first partial program flag cell PPFC1 and data "1" is stored in the second partial program flag cell PPFC2, indicating that an LSB program operation has been carried out once, data "0" is stored in the second partial program flag cell PPFC2 during an LSB program operation in step S120. At this time, the first partial program flag cell PPFC1 is program inhibited, such that previously stored data (i.e., data "0") is maintained.

Since the first and second partial program flag cells PPFC1 and PPFC2 connected to the word line selected by the address ADDR each have data "0", a partial MSB program operation may be conducted in step S130 using the second threshold voltage state order.

When data "0" is stored in each of the first and second partial program flag cells PPFC1 and PPFC2, indicating that an LSB program operation has been conducted twice (or more), the first and second partial program flag cells PPFC1 and PPFC2 are program inhibited during an LSB program operation, such that previously stored data (i.e., data "0") is maintained in each.

As discussed above, since the first and second partial program flag cells PPFC1 and PPFC2 connected to the word line selected by the address ADDR each have data "0", a partial MSB program operation may be conducted using the second threshold voltage state order.

Accordingly, the non-volatile memory device 100 is able to determine whether to perform a program operation in a threshold voltage state order supporting a partial program operation, or in a threshold voltage state order supporting a fast read operation, based on data of the second partial program flag cell PPFC2 during an MSB program operation.

Figure 5:
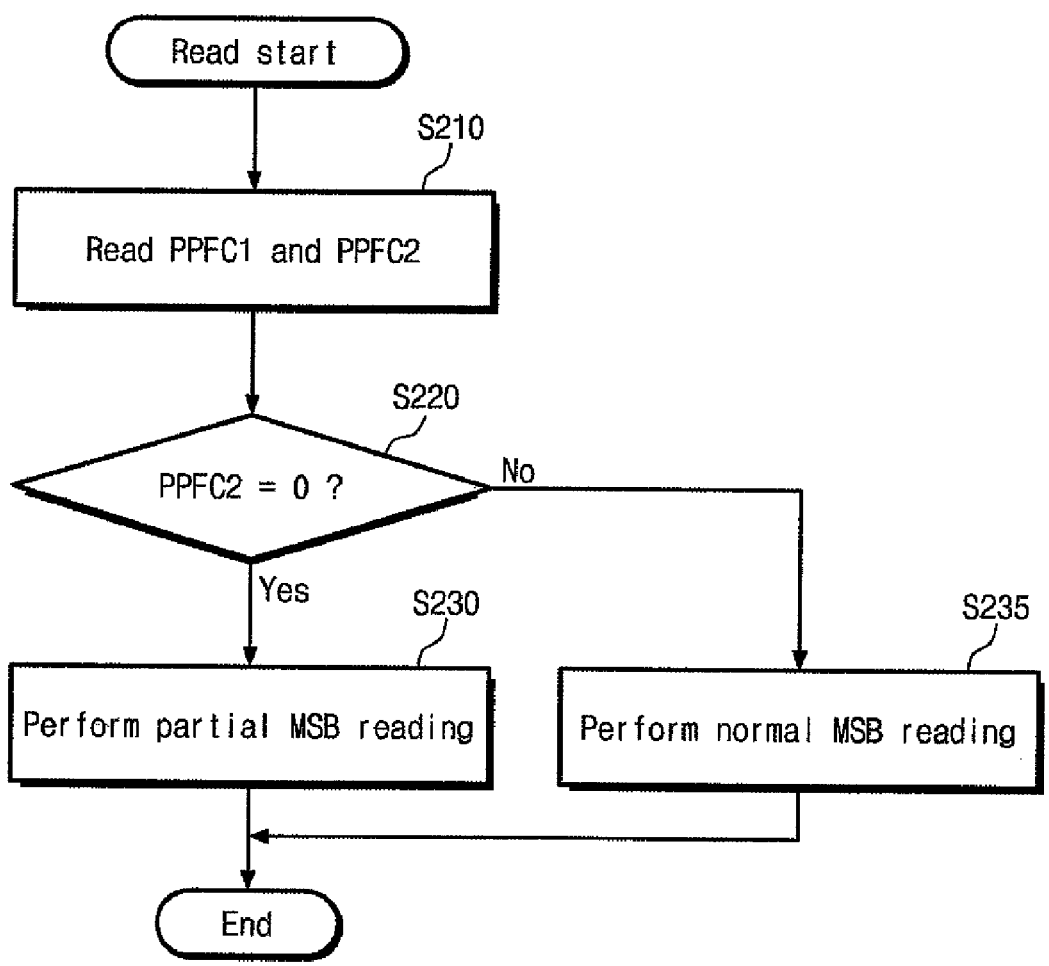
FIG. 5 is a flow chart showing a read method of a non-volatile memory device, according to an illustrative embodiment.

FIG. 5 is a flow chart showing a read method of a non-volatile memory device, according to an illustrative embodiment. A read method of non-volatile memory device 100 will be more fully described below with reference to FIGS. 1 to 5. As illustrated in FIG. 3, it is assumed that data "0" is stored in the second partial program flag cell PPFC2 where a partial program operation is conducted, and data "1" is stored in the second partial program flag cell PPFC2 where a normal program operation is conducted. FIG. 5 depicts a read operation conducted under this assumption.

In step S210, data is read out from the first and second partial program flag cells PPFC1 and PPFC2, which are connected to a word line corresponding to an address ADDR input according to a read command.

In step S220, the control logic circuit 140 determines whether data "0" is stored in the second partial program flag cell PPFC2. An MSB read operation is performed in either the first or second threshold voltage state order, based on the determination result.

When data "0" is stored in the second partial program flag cell PPFC2 (as well as in the first partial program flag cell PPFC1), indicating that a partial program operation has been performed, an MSB read operation is performed in step S230 using the second threshold voltage state order with respect to the word line selected by the address ADDR. In this case, the MSB read operation may be conducted using three read voltages $V_{PR1}$, $V_{PR2}$, and $V_{PR3}$.

On the other hand, when data "1" is stored in the second partial program flag cell PPFC2, indicating that a normal program operation has been performed, a normal MSB read operation is performed in step S235 using the first threshold voltage state order with respect to the word line selected by the address ADDR. In this case, the MSB read operation may be conducted using two read voltages $V_{NR1}$ and $V_{NR2}$.

Accordingly, the non-volatile memory device 100 is able to perform read operations in different threshold voltage state orders, based on at least data stored in the second partial program flag cell PPFC2.

Figure 6:
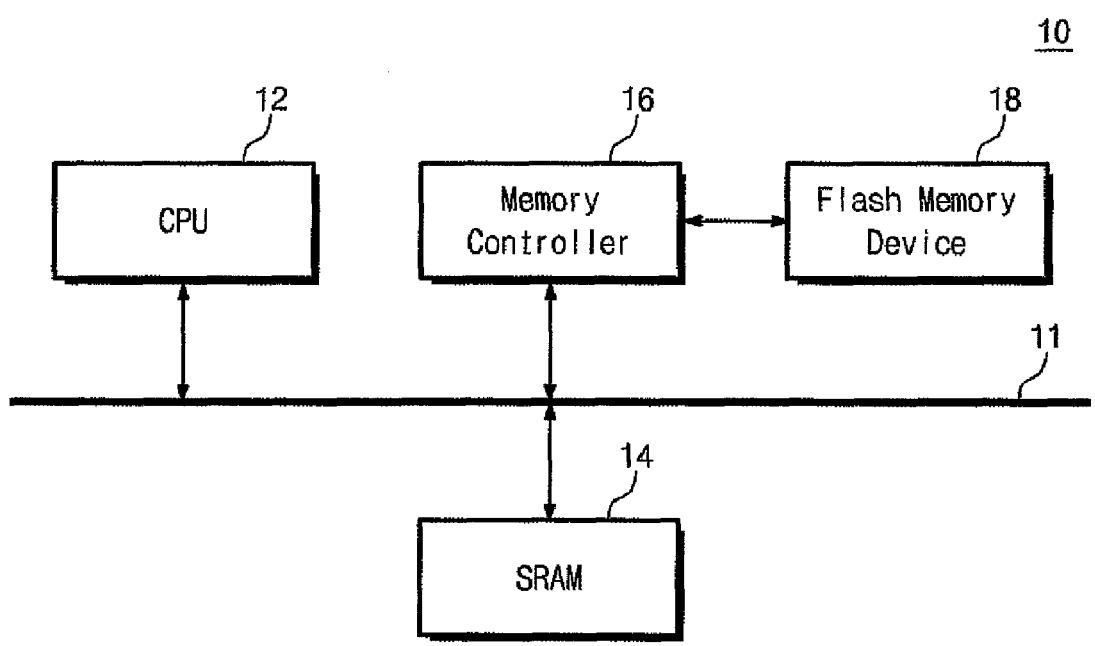
FIG. 6 is a block diagram showing a memory system, including a non-volatile memory device, according to an illustrative embodiment.

FIG. 6 is a block diagram showing a memory system including a non-volatile memory device, according to an illustrative embodiment.

Referring to FIG. 6, a memory system 10 includes central processing unit (CPU) 12, static random access memory (SRAM) 14, memory controller 16, and flash memory device 18. The CPU 12, the SRAM 14, and the memory controller 16 are electrically connected to a bus 11. The flash memory device 18 includes a devices illustrated and discussed with respect to FIGS. 1 through 5. N-bit data (where N is an integer greater than or equal to 1) processed or to be processed by the CPU 12 are stored in the flash memory device 18 under control of the memory controller 16.

Although not illustrated in figures, the memory system 10 may further include application chipsets, a camera image processor (CIS), mobile dynamic random access memory (DRAM), and the like. Also, the memory controller 16 and the flash memory device 18 may constitute a solid state disk/drive (SSD), which uses non-volatile memory devices to store data.

A flash memory device and/or a memory controller may be packaged using various types of packages. For example, the flash memory device and/or the memory controller may use packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

As described above, a non-volatile memory device stores an LSB program number for each word line and performs MSB program operations using a threshold voltage state order corresponding to the stored LSB program number. Thus, the non-volatile memory device executes normal and partial program operations and improves an overall read speed.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A non-volatile memory device, comprising:
    a plurality of memory cells including at least one first memory cell connected to a first wordline and at least one second memory cell connected to a second wordline;
    a page buffer connected to the memory cells through bitlines; and
    a control logic configured to control the page buffer to program the first memory cell based on a first threshold voltage state order and the second memory cell based on a second threshold voltage state order in a program operation, the first and second threshold voltage state orders being different, and to read each of the first memory cell and the second memory cell according to different read schemes in a read operation.

2. The non-volatile memory device of the claim 1, further comprising:
    third and fourth memory cells respectively connected to the first and second wordlines, and each of the third and fourth memory cells configured to store data in relation to the corresponding first and second threshold voltage state orders.

3. The non-volatile memory device of the claim 1, wherein a number of sensing operations is different according to data determined by a first page program operation in the read operation.

4. The non-volatile memory device of the claim 1, wherein read voltages are different according to data determined by a first page program operation in the read operation.

5. The non-volatile memory device of the claim 1, wherein the control logic comprises:
    a first control logic configured to control the page buffer according to the first threshold voltage state order; and
    a second control logic configured to control the page buffer according to the second threshold voltage state order.

6. The non-volatile memory device of the claim 1, wherein the control logic is further configured to control the page buffer to perform another program operation to the first memory cell after the program operation, wherein the second threshold voltage state order is applied to program the first memory cell in the another program operation.

7. The non-volatile memory device of the claim 6, wherein the control logic further is configured to control the page buffer to perform another read operation to the first memory cell after the another program operation, wherein the second threshold voltage state order is applied to read the first memory cell in the another read operation.

8. A program method of a non-volatile memory device, comprising:
    performing a least significant bit (LSB) program operation, during which a number of the LSB program operation is stored; and
    performing a most significant bit (MSB) program operation in a threshold voltage state order determined according to the number of the LSB program operation.

9. The program method of claim 8, wherein the number of LSB program operation is stored in flag cells connected to a selected word line during the LSB program operation.

10. The program method of claim 9, wherein the flag cells comprise a first flag cell for storing data "0" when a first LSB program operation is performed with respect to the selected word line, and a second flag cell for storing data "0" when a second LSB program operation is performed with respect to the selected word line.

11. The program method of claim 10, wherein data "0" is stored in the first and second flag cells when an LSB program operation is performed two or more times with respect to the selected word line.

12. The program method of claim 9, wherein the threshold voltage state order of the MSB program operation is "11", "01", "00" and "10" when the number of LSB program operation is 1.

13. The program method of claim 9, wherein the threshold voltage state order of the MSB program operation is "11", "01", "10" and "00" when the number of LSB program operation line is greater than 1.

14. A read method of a non-volatile memory device, comprising:
    identifying a number of a least significant bit (LSB) program operation;
    determining a threshold voltage state order according to the number of the LSB program operation; and
    performing a most significant bit (MSB) read operation based on the determined threshold voltage state order.

15. The read method of claim 14, wherein the number of the LSB program operation is stored during the LSB program operation.

16. The read method of claim 14, wherein the number of the LSB program operation is stored in flag cells of a selected word line during the LSB program operation.

17. The read method of claim 14, wherein the MSB read operation is performed according to a first threshold voltage state order when the number of the LSB program operation is 1 and according to a second threshold voltage state order when the number of the LSB program operation is at least 2, the first and second threshold voltage state orders being different from each other.

18. The read method of claim 17, wherein the first threshold voltage state order corresponds to a normal program operation, and the second threshold voltage state order corresponds to a partial program operation.

* * * * *